(12) United States Patent
Li

(10) Patent No.: US 10,777,765 B2
(45) Date of Patent: Sep. 15, 2020

(54) OLED DEVICE AND METHOD FOR FABRICATING THEREOF

(71) Applicant: Wuhan China Star Optoelectronics Semiconductor Display Technology Co., Ltd., Wuhan, Hubei (CN)

(72) Inventor: Xianjie Li, Guangdong (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 369 days.

(21) Appl. No.: 15/748,586

(22) PCT Filed: Dec. 20, 2017

(86) PCT No.: PCT/CN2017/117360
§ 371 (c)(1),
(2) Date: Jan. 29, 2018

(87) PCT Pub. No.: WO2019/095501
PCT Pub. Date: May 23, 2019

(65) Prior Publication Data
US 2020/0091455 A1 Mar. 19, 2020

(30) Foreign Application Priority Data
Nov. 20, 2017 (CN) .......................... 2017 1 1177820

(51) Int. Cl.
*H01L 51/50* (2006.01)
*H01L 51/56* (2006.01)
*H01L 51/00* (2006.01)

(52) U.S. Cl.
CPC ........ *H01L 51/5092* (2013.01); *H01L 51/001* (2013.01); *H01L 51/0051* (2013.01);
(Continued)

(58) Field of Classification Search
CPC .............. H01L 51/5092; H01L 51/001; H01L 51/0051; H01L 51/5056
See application file for complete search history.

(56) References Cited

U.S. PATENT DOCUMENTS

| 2003/0025445 | A1  | 2/2003 | Lee |
|---|---|---|---|
| 2012/0091448 | A1* | 4/2012 | Ueno .................... H01L 51/506 257/40 |

(Continued)

FOREIGN PATENT DOCUMENTS

| CN | 102276831 A | 12/2011 |
|---|---|---|
| CN | 102630670 A | 8/2012 |

(Continued)

*Primary Examiner* — Christine A Enad
(74) *Attorney, Agent, or Firm* — Hemisphere Law, PLLC; Zhigang Ma

(57) ABSTRACT

The present application discloses an OLED device and a method for fabricating thereof. The device includes an electron injection layer, the electron injection layer is a surfactant embedded polyacid composite. By the above method, the present invention can make the internal electron injection into the device more effective, the device has higher luminous efficiency, and the fabricating process is simple, the stability is high, and the film quality is good.

15 Claims, 4 Drawing Sheets

(52) U.S. Cl.
CPC .......... *H01L 51/5056* (2013.01); *H01L 51/56* (2013.01); *H01L 2251/305* (2013.01)

(56) References Cited

U.S. PATENT DOCUMENTS

| | | | |
|---|---|---|---|
| 2015/0041683 A1* | 2/2015 | Horner | G02F 2/02 250/474.1 |
| 2018/0183011 A1* | 6/2018 | Oikawa | H05B 33/26 |
| 2018/0198095 A1* | 7/2018 | Sassa | F26B 13/00 |

FOREIGN PATENT DOCUMENTS

| | | |
|---|---|---|
| CN | 102935381 A | 2/2013 |
| CN | 104001544 A | 8/2014 |
| CN | 104183774 A | 12/2014 |
| CN | 104689850 A | 6/2015 |
| CN | 105390293 A | 3/2016 |
| CN | 105623673 A | 6/2016 |
| JP | 2005142122 A | 6/2005 |

\* cited by examiner

OLED DEVICE AND METHOD FOR FABRICATING THEREOF

RELATED APPLICATIONS

The present application is a National Phase of International Application Number PCT/CN2017/117360, filed Dec. 20, 2017, and claims the priority of China Application 201711177820.8, filed Nov. 20, 2017.

FIELD OF THE DISCLOSURE

The disclosure relates to a display technical field, and more particularly to an OLED device and a method for fabricating thereof.

BACKGROUND

Organic electroluminescent devices, OLEDs have shown great potential in the fields of display and lighting due to their advantages of simple fabricating process, wide range of materials, controllable structures, and slimness and curling. OLED display is a very promising flat panel display technology, it has the characteristics of self-luminous, simple structure, ultra-thin, fast response, wide viewing angle, low power consumption and can achieve flexible display, known as "Dream Display".

It is noteworthy that, although the OLED has achieved commercial production, but the device luminous efficiency is still much room for improvement. In the conventional technology, the electron injection layer (cathode modification layer) of the OLED is mostly a metal oxide or a polymer material. During the long-term research and development process, the inventor of the present application found that the above-mentioned technologies are not good enough for electron injection capability, and have high fabrication cost, with low luminous efficiency of the device.

SUMMARY

The main technical problem to be solved by the present application is to provide an OLED device and a method for fabricating thereof to make the electron injection into the device more effective, improve the luminous efficiency of the device, and have the advantages of simple fabricating process, high stability and good film-forming quality.

In order to solve the above technical problem, one technical solution adopted by the present application is to provide an OLED device including: an electron injection layer, the electron injection layer is a surfactant embedded polyacid composite; wherein, the electron injection layer is tetra-octylammonium embedded silicotungstic acid;

Wherein the device further includes:

A substrate;

An anode formed on the substrate;

A hole injection layer formed on the anode;

A hole transport layer formed on the hole injection layer;

A light emitting layer formed on the hole transport layer;

An electron transport layer formed on the light emitting layer;

A cathode formed on the electron injection layer;

Wherein the electron injection layer is formed on the electron transport layer.

In order to solve the above technical problem, another technical solution adopted by the present application is to provide an OLED device, the OLED device includes an electron injection layer and the OLED device is a surfactant embedded polyacid composite.

In order to solve the above technical problem, another technical solution adopted by the present application is to provide a method for fabricating an OLED device, the method including: providing a substrate; depositing a layer of anode material on the substrate by a method of magnetron sputtering to form an anode; depositing a hole injection layer material, a hole transport layer material, a light emitting layer material, an electron transport layer material sequentially on the anode by a vacuum evaporation deposition method and by adapting a multi-source organic molecular vapor deposition system, to form a hole injection layer, a hole transport layer, a light emitting layer and an electron transport layer sequentially; depositing a surfactant embedded polyacid composite solution on the electron transport layer by a material spin-on method in an inert gas environment to form an electron injection layer; and forming a cathode on the electron injection layer by the vacuum evaporation deposition method to form the OLED device.

The present application has the following beneficial effects: Compared with the conventional technology, the OLED device provided by the present application includes: an electron injection layer, and the electron injection layer is a surfactant embedded polyacid composite. Since the surfactant embedded polyacid composite is a type of material with excellent optoelectronic properties, that have a tunable work function, that is suited for use as an electrode modification layer; and such material is low cost, green, environmentally friendly, high transmittance, capable of wet process, no return processing required; in this way, can make the electron injection of the device more effective, the device luminous efficiency is higher, and the fabrication process is relatively simple, high stability, with good film quality.

BRIEF DESCRIPTION OF THE DRAWINGS

In order to describe the technical solutions in the embodiments of the present application more clearly, the following briefly introduces the accompanying drawings required for describing the embodiments. Apparently, the accompanying drawings in the following description are merely some embodiments of the present application, for those skilled in the art, other drawings can be obtained based on these drawings without creative efforts. Wherein.

DETAILED DESCRIPTION OF PREFERRED EMBODIMENTS

The technical solutions in the embodiments of the present application are clearly and completely described below with reference to the accompanying drawings in the embodiments of the present application. Apparently, the described embodiments are merely a part but not all of the embodiments of the present application. All other embodiments obtained by a person of ordinary skill in the art based on the embodiments of the present application without creative efforts shall fall within the protection scope of the present disclosure.

Figure 1:
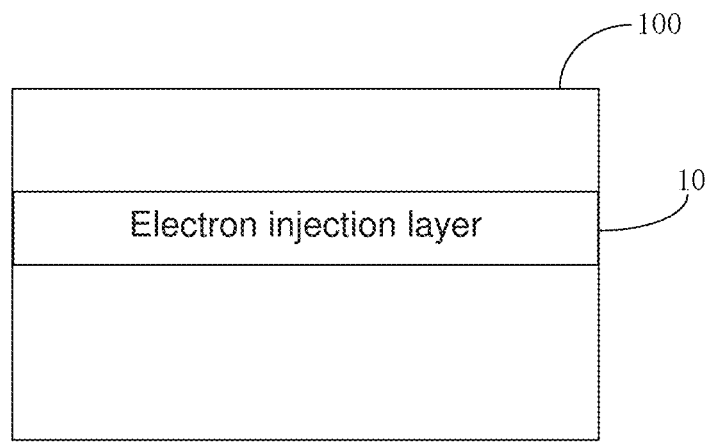
FIG. 1 is a schematic structural view of one embodiment of an OLED device of the present application.

Referring to FIG. 1, FIG. 1 is a schematic structural view of one embodiment of an OLED device of the present application. The device 100 includes an electron injection layer 10. The electron injection layer 10 is a surfactant embedded polyacid composite.

The electron injection layer, EIL improves the carrier injection capability and further improves device performance, and is usually introduced between the cathode layer and the electron transport layer, ETL.

The surfactant embedded polyacid composite is a type of material with excellent optoelectronic properties, that have a tunable work function, that is well suited for use as an electrode modification layer; and such material is low cost (less than $1 per gram), green environmentally friendly, high transmittance (greater than 90% of visible light transmission), capable of wet process, no return processing required and ideal for industrial production of low cost, large area and flexible substrate devices.

For example: selecting cationic surfactants such as 1-HexadecylpyridiniuM bromide, cetyltrimethylammonium bromide and tetra-n-butylammonium nitrate to fabricat of a surfactant embedded polyacid composite, a surfactant embedded heteropolyacid composite, a surfactant embedded rare earth heteropolyacid composite and the like by electrostatic embedding of phosphotungstic acid and silicotungstic acid.

The OLED device provided by the embodiment of the present application includes the electron injection layer, the electron injection layer is a surfactant embedded polyacid composite. Since the surfactant embedded polyacid composite is a type of material with excellent optoelectronic properties, that have a tunable work function, that is suited for use as an electrode modification layer; and such material is low cost, green, environmentally friendly, high transmittance, capable of wet process, no return processing required; in this way, can make the electron injection of the device more effective, the device luminous efficiency is higher, and the fabrication process is relatively simple, high stability, with good film quality.

In one embodiment, the electron injection layer is tetraoctylammonium embedded silicotungstic acid. Wherein, surfactants include, but are not limited to, tetraoctylammonium bromide, tetraoctylammonium chloride, and the like. Further, the molecular formula of tetraoctylammonium embedded silicotungstic acid is $[(C_8H_{17})_4N]_4[SiW_{12}O_{40}]$. Wherein, the electron injection layer can be fabricated by a wet film-forming method. The method has the advantages of simple fabricating process, high stability and good film-forming quality. For example, it can be fabricated by the methods such as ink-jet printing, IJP, nozzle printing, etc. The thickness of the electron injection layer may be between 0.5 nm and 10 nm.

Figure 2:
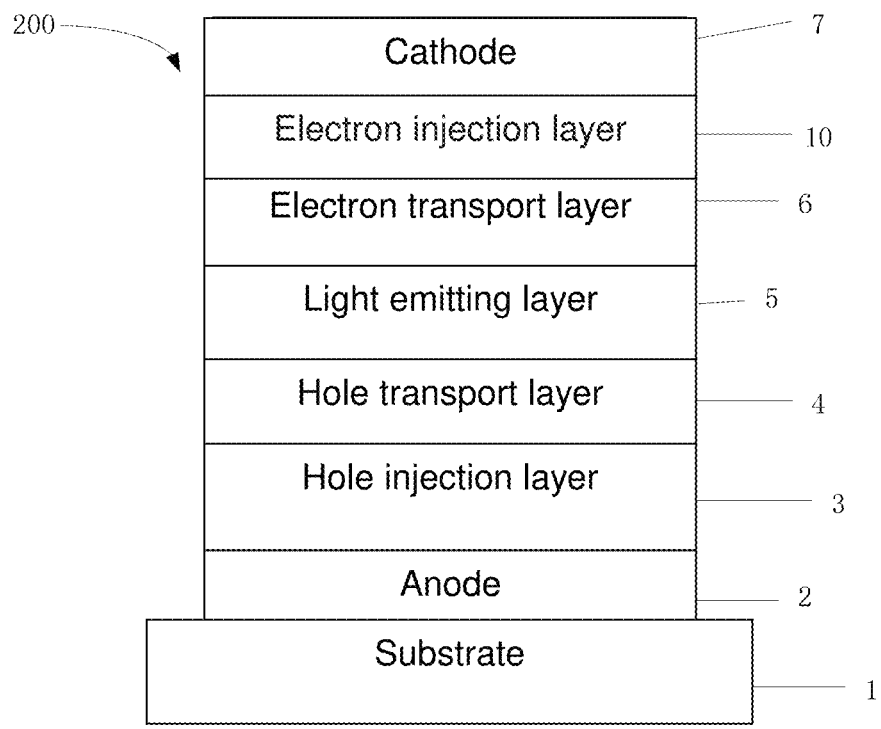
FIG. 2 is a schematic structural view of another embodiment of the OLED device of the present application.

Referring to FIG. 2, FIG. 2 is a schematic structural view of another embodiment of the OLED device of the present application. In the present embodiment, the OLED device 200 includes a substrate 1, an anode 2, a hole injection layer 3, a hole transport layer 4, Layer 5, an electron transport layer 6, an electron injection layer 10, and a cathode 7. The electron injection layer 10 is formed on the electron transport layer 6, and the electron injection layer 10 is any of the electron injection layers described above. For a detailed description of the related contents, please refer to the above part and will not be repeated here.

The substrate 1 is a glass substrate or a flexible substrate having high visible light transmittance.

The anode 2 is formed on the substrate 1. Wherein, the material of the anode is a transparent conductive metal oxide material such as Indium Tin Oxide, ITO, Indium Zinc Oxide, IZO, or the like, or a metallic material with high work function such as Au, Pt, Ag or an alloy of these metals. These anode materials can be used alone or in combination of two or more. Wherein the thickness of the anode is between 20 nm and 200 nm.

The hole injection layer 3 is formed on the anode 2, and the hole injection layer 3 is used to help inject holes from the anode 2 into the hole transport layer 4. The material of the hole injection layer 3 may be an organic small molecule hole injection material such as: HATCN, such as Dipyrazino[2,3-f:2',3'-h]quinoxaline-2,3,6,7,10,11-hexacarbonitrile, etc; the material for the hole injection layer 3 may also be a polymer hole injection material, such as PEDOT:PSS, etc., alternatively, the material of the hole injection layer 3 may also be a metal oxide hole injection material, such as $MoO_3$. In one embodiment, the hole injection layer 3 is fabricated by a vacuum evaporation deposition method or a wet film-forming method, such as ink jet printing, nozzle printing, or the like. The thickness of the hole injection layer 3 is between 1 nm and 100 nm.

The hole transport layer 4 is formed on the hole injection layer 3. The hole transport layer 4 is used to transport holes from the hole injection layer 3 to the light emitting layer 5. The material of the hole transport layer 4 may be an organic small molecule hole transport materials such as NPB, that is N,N'-Bis-(1-naphthalenyl)-N,N'-bis-phenyl-(1,1'-biphenyl)-4,4'-diamine; or TAPC, that is 4,4'-yclohexylidenebis[N,N-bis(p-tolyl)aniline], the material of the hole transport layer 4 can also be a polymer hole transport material, such as Poly-TPD, that is Poly[bis(4-phenyl)(4-butylphenyl)amine] and the like. In an embodiment, the hole transport layer 4 is fabricated by a vacuum evaporation deposition method or a wet film-forming method, such as the ink jet printing, the nozzle printing, or the like. The thickness of the hole transport layer 4 is between 10 nm and 200 nm.

The light emitting layer 5 is formed on the hole transport layer 4; the light emitting layer 5 is used for recombination and emission of electrons and holes in the light emitting layer 5. The material of the light emitting layer 5 may be an organic small molecule fluorescent material or a polymer fluorescent material, and may also be a small molecule phosphorescent material or a polymer phosphorescent material. The light emitting layer 5 may be formed by host-guest doping type or non-doping type. In one embodiment, the light emitting layer 5 is fabricated by the vacuum evaporation deposition method or the wet film-forming method, such as the ink jet printing, the nozzle printing, or the like. The thickness of the light emitting layer 5 is between 5 nm and 50 nm.

The electron transport layer 6 is formed on the light emitting layer 5; the electron transport layer is an organic electron transport material, the material of the electron transport layer may be an organic electron transport material such as Alq3 (that is tris(8-quinolinolato)aluminum) or the like; or is imidazole electron transport material, such as TPBi (that is 1,3,5-Tris(1-phenyl-1H-benzimidazol-2-yl) benzene) or the like. The electron transport layer 6 is fabricated by the wet film-forming method, the thickness between 10 nm and 100 nm.

The cathode 7 is formed on the electron injection layer 10. The material of the cathode 7 is a low work function metal material, such as Li, Mg, Ca, Sr, La, Ce, Eu, Yb, Al, Cs, Rb or alloys of these metals, these cathode materials may be used alone or in combination of two or more. In one embodiment, the cathode 7 is fabricated by the vacuum evaporation deposition method, the thickness of the cathode 7 is between 10 nm and 1000 nm.

The present application further provides a method for fabricating an OLED device. It should be noted that, the fabricating method of the present embodiment can be used for fabricating the above-mentioned OLED device. For a detailed description of the related content can be referred by the above OLED device part, and no further description is provided herein.

The method includes:

A, providing the substrate;

B, depositing a layer of anode material on the substrate by using the method of magnetron sputtering to form an anode;

C, depositing a hole injection layer material, a hole transport layer material, a light emitting layer material, an electron transport layer material on the anode sequentially by vacuum evaporation deposition method and by adapting of multi-source organic molecular vapor deposition system, to form a hole injection layer, a hole transport layer, a light emitting layer and an electron transport layer sequentially.

D, depositing a surfactant embedded polyacid composite solution on the electron transport layer in an inert gas environment by a material spin-on method to form an electron injection layer;

E, forming a cathode on the electron injection layer by the vacuum evaporation deposition method, and then an OLED device is fabricated.

Wherein the electron injection layer is tetraoctylammonium embedded silicotungstic acid, the molecular formula of tetraoctylammonium embedded silicotungstic acid is $[(C_8H_{17})_4N]_4[SiW_{12}O_{40}]$, the thickness of the electron injection layer may be between 0.5 nm and 10 nm. The material of the anode is at least one of a transparent conductive metal oxide material and a high work function metal material; the thickness of the anode is between 20 nm and 200 nm; the material of the hole injection layer is organic small molecule hole injection material, polymer hole injection material or metal oxide hole injection material; the hole injection layer is fabricated by vacuum evaporation deposition method or wet film-forming method, the thickness of the hole injection layer is between 1 nm and 100 nm; the material of the hole transport layer is an organic small molecule hole transport material or a polymer hole transport material; the hole transport layer is fabricated by a vacuum evaporation deposition method or a wet film-forming method; the thickness of the hole injection layer is between 10 m and 200 m; the material of the light emitting layer is an organic small molecule fluorescent material, a polymer fluorescent material, a small molecule phosphorescent material or a polymer phosphorescent material; the light emitting layer is fabricated by a vacuum evaporation deposition method or a wet film-forming method; the thickness of the light emitting layer is between 5 nm and 50 nm; the material of the electron transport layer is an organic electron transport material or imidazole electron transport material; the electron transport layer is fabricated by a wet film-forming method; the thickness of the electron transport layer is between 10 nm and 100 nm; the material of the cathode is a metal material with a low work function; the cathode is fabricated by the vacuum evaporation deposition method; the thickness of the cathode is between 10 nm and 1000 nm.

In the following, a specific embodiment is used to describe the above OLED device of the present application.

Figure 3:
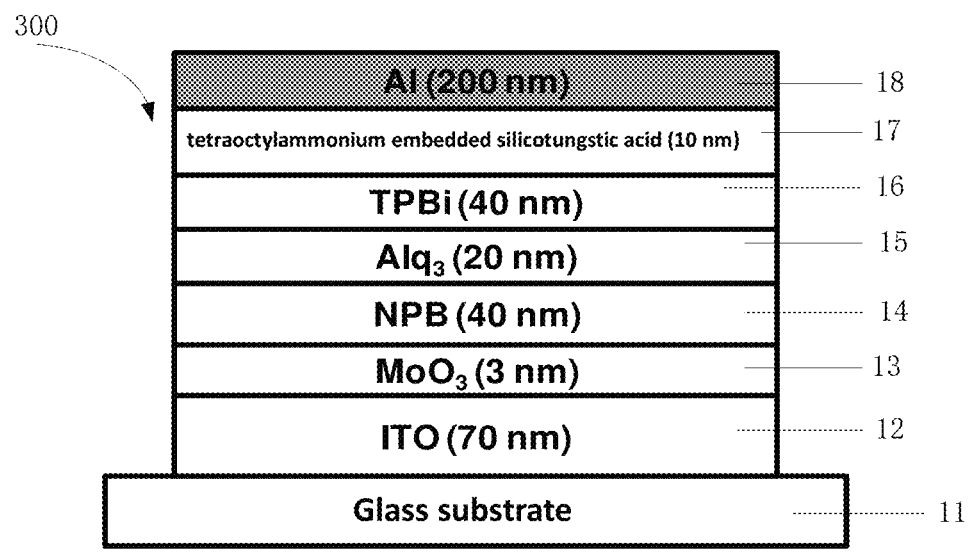
FIG. 3 is a schematic structural view of a specific embodiment of an OLED device of the present application.

Referring to FIG. 3, FIG. 3 is a schematic structural view of a specific embodiment of an OLED device of the present application. In this embodiment, the device 300 selects the glass substrate 11 as a substrate, a 70 nm ITO transparent conductive film 12 (anode) is deposited on the glass substrate 11 by magnetron sputtering, followed by adapting the multi-source organic molecule vapor deposition system, a $MoO_3$ layer 13 (3 nm, hole injection layer), a NPB layer 14 (40 nm, hole transport layer), an $Alq_3$ layer 15 (20 nm, light emitting layer), a TPBi layer 16 (40 nm, electron transport layer) is sequentially deposited by vacuum evaporation deposition method. Next, dissolving the tetra-octylammonium-silicotungstic acid in a methanol solution, and a tetra-octylammonium-immobilized silicotungstic acid solution is deposited on the TPBi layer 16 in a nitrogen atmosphere using the material spin-coating method to obtain a 10 nm tetraoctylammonium embedded silicotungstic acid thin film 17 (electron injection layer) after drying. Then, an Al layer 18 (cathode) with thickness of 200 nm is formed on the tetraoctylammonium embedded silicotungstate acid thin film 17 by vacuum evaporation deposition method to fabricate the OLED device. Referring to Table 1, Table 1 shows an abbreviation of the material, name and the fabrication method used in this example.

TABLE 1 the abbreviation of the material and name used in this example.

| | Abbreviation | Name | Fabrication method |
| --- | --- | --- | --- |
| Anode | ITO | Indium Tin Oxide | magnetron sputtering |
| Hole injection layer | $MoO_3$ | Molybdenum oxide | vacuum evaporation deposition |
| Hole transport layer | NPB | N,N'-diphenyl-N,N'-(1-naphthyl)-1,1'-biphenyl-4,4'-diamine | vacuum evaporation deposition |
| Light emitting layer | $Alq_3$ | Tris(8-quinolinolato)aluminum | vacuum evaporation deposition |
| Electron transport layer | TPBi | 1,3,5-Tris(1-phenyl-1H-benzimidazol-2-yl)benzene | vacuum evaporation deposition |

TABLE 1-continued the abbreviation of the material and name used in this example.

| | Abbreviation | Name | Fabrication method |
|---|---|---|---|
| Electron injection layer | $[(C_8H_{17})_4N]_4[SiW_{12}O_{40}]$ | tetraoctylammonium embedded silicotungstic acid | wet film-forming |
| cathode | Al | aluminum | vacuum evaporation deposition |

Figure 4:
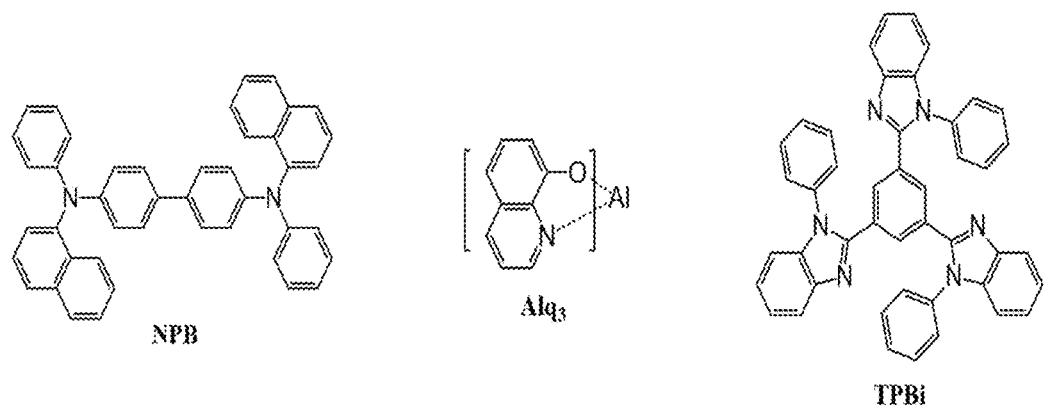
FIG. 4 is the molecular structure of the organic material in the OLED device of FIG. 3.
Figure 5:
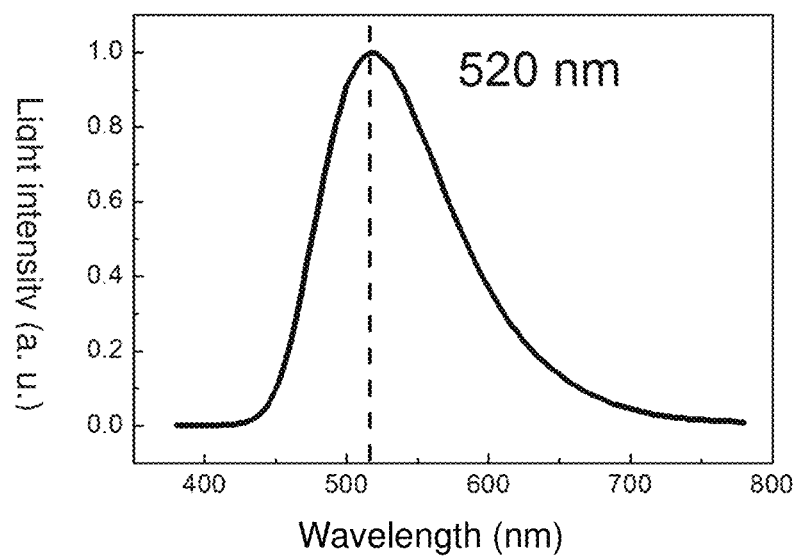
FIG. 5 is a schematic electroluminescence spectrum of the OLED device of FIG. 3.
Figure 6:
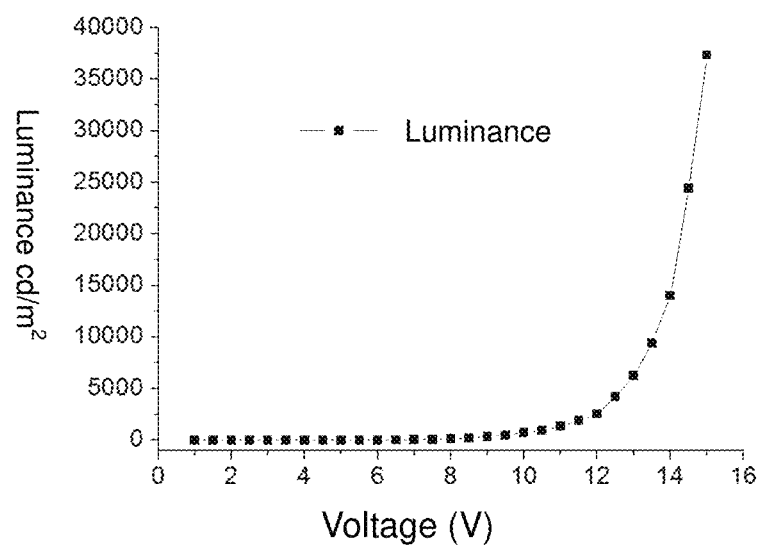
FIG. 6 is a voltage-luminance curve of the OLED device of FIG. 3.
Figure 7:
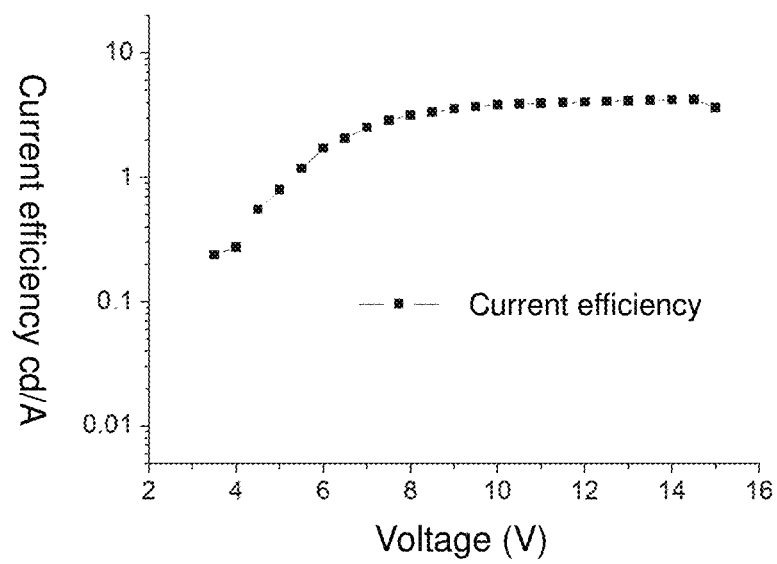
FIG. 7 is a current efficiency curve of the OLED device of FIG. 3.

FIG. 4 is the molecular structure of the organic material in the OLED device of this embodiment. FIG. 5 is a schematic electroluminescence spectrum of the OLED device of this embodiment, with the peak wavelength at 520 nm. FIG. 6 is a voltage-luminance curve of the OLED device of the present embodiment, it can be seen from the FIG., the maximum luminance of the OLED device of the present embodiment can reach 37300 cd/m². FIG. 7 is a current efficiency curve of the OLED device of the present embodiment, it can be seen from the FIG., the maximum current efficiency of the OLED device in this embodiment reaches 4.3 cd/A.

The OLED device provided by the embodiment of the present application includes the electron injection layer, the electron injection layer is a surfactant embedded polyacid composite. Since the surfactant embedded polyacid composite is a type of material with excellent optoelectronic properties, that have a tunable work function, that is suited for use as an electrode modification layer; and such material is low cost, green, environmentally friendly, high transmittance, capable of wet process, no return processing required; in this way, can make the electron injection of the device more effective, the device luminous efficiency is higher, and the fabrication process is relatively simple, high stability, with good film quality.

The foregoing contents are detailed description of the disclosure in conjunction with specific preferred embodiments and concrete embodiments of the disclosure are not limited to these descriptions. For the person skilled in the art of the disclosure, without departing from the concept of the disclosure, simple deductions or substitutions can be made and should be included in the protection scope of the application.

What is claimed is:

1. An OLED device, comprising:
an electron injection layer, wherein the electron injection layer is a surfactant embedded polyacid composite, wherein the electron injection layer is tetraoctylammonium embedded silicotungstic acid;
wherein the OLED device further comprises:
a substrate;
an anode formed on the substrate;
a hole injection layer formed on the anode;
a hole transport layer formed on the hole injection layer;
a light emitting layer formed on the hole transport layer;
an electron transport layer formed on the light emitting layer;
a cathode formed on the electron injection layer; and
wherein the electron injection layer is formed on the electron transport layer.

2. The OLED device according to claim 1, wherein a molecular formula of tetraoctylammonium embedded silicotungstic acid is $[(C_8H_{17})_4N]_4[SiW_{12}O_{40}]$.

3. The OLED device according to claim 1, wherein the electron injection layer is fabricated by a wet film-forming method.

4. The OLED device according to claim 1, wherein a thickness of the electron injection layer is between 0.5 nm and 10 nm.

5. The OLED device according to claim 1, wherein a material of the anode is one of a transparent conductive metal oxide material or a metallic material with high work function, a thickness of the anode is between 20 nm and 200 nm, a material of the hole injection layer is an organic small molecule hole injection material, a polymer hole injection material, or a metal oxide hole injection material, the hole injection layer is fabricated by a vacuum evaporation deposition or a wet film-forming method, a thickness of the hole injection layer is between 1 nm and 100 nm, a material of the hole transport layer is an organic small molecule hole transport material or a polymer hole transport material, the hole transport layer is fabricated by the vacuum evaporation deposition method or the wet film-forming method, a thickness of the hole transport layer is between 10 nm and 200 nm.

6. The OLED device according to claim 1, wherein a material of the light emitting layer is an organic small molecule fluorescent material, a polymer fluorescent material, a small molecule phosphorescent material or a polymer phosphorescent material, the light emitting layer is fabricated by a vacuum evaporation deposition method or the wet film-forming method, and a thickness of the light emitting layer is between 5 nm and 50 nm, wherein a material of the electron transport layer is an organic electron transport material or imidazole electron transport material, the electron transport layer is fabricated by a wet film-forming method, a thickness of the electron transport layer is between 10 nm and 100 nm, a material of the cathode is a low work function metal material, the cathode is fabricated by the vacuum evaporation deposition method, the thickness of the cathode is between 10 nm and 1000 nm.

7. An OLED device, comprising:
an electron injection layer, wherein the electron injection layer is a surfactant embedded polyacid composite;
wherein the electron injection layer comprises tetraoctylammonium embedded silicotungstic acid.

8. The OLED device according to claim 7, wherein a molecular formula of tetraoctylammonium embedded silicotungstic acid is $[(C_8H_{17})_4N]_4[SiW_{12}O_{40}]$.

9. The OLED device according to claim 7, wherein the electron injection layer is fabricated by a wet film-forming method.

10. The OLED device according to claim 7, wherein a thickness of the electron injection layer is between 0.5 nm and 10 nm.

11. The OLED device according to claim 7, wherein the OLED device further comprises:
a substrate;
an anode formed on the substrate;
a hole injection layer formed on the anode;
a hole transport layer formed on the hole injection layer;
a light emitting layer formed on the hole transport layer;
an electron transport layer formed on the light emitting layer;
a cathode formed on the electron injection layer; and
wherein the electron injection layer is formed on the electron transport layer.

12. The OLED device according to claim 11, wherein a material of the light emitting layer is an organic small molecule fluorescent material, a polymer fluorescent material, a small molecule phosphorescent material or a polymer phosphorescent material, the light emitting layer is fabricated by a vacuum evaporation deposition method or the wet film-forming method, and a thickness of the light emitting layer is between 5 nm and 50 nm, a material of the electron transport layer is an organic electron transport material or imidazole electron transport material, the electron transport layer is fabricated by a wet film-forming method, a thickness of the electron transport layer is between 10 nm and 100 nm, a material of the cathode is a low work function metal material, the cathode is fabricated by a vacuum evaporation deposition method, the thickness of the cathode is between 10 nm and 1000 nm.

13. The OLED device according to claim 11, wherein a material of the anode is one of a transparent conductive metal oxide material or a metallic material with high work function, a thickness of the anode is between 20 nm and 200 nm, a material of the hole injection layer is an organic small molecule hole injection material, a polymer hole injection material, or a metal oxide hole injection material, the hole injection layer is fabricated by a vacuum evaporation deposition or a wet film-forming method, a thickness of the hole injection layer is between 1 nm and 100 nm, a material of the hole transport layer is an organic small molecule hole transport materials or a polymer hole transport material, the hole transport layer is fabricated by a vacuum evaporation deposition method or a wet film-forming method, a thickness of the hole transport layer is between 10 nm and 200 nm.

14. A method for fabricating an OLED device, comprising:
providing a substrate;
depositing a layer of anode material on the substrate by a method of magnetron sputtering to form an anode;
depositing a hole injection layer material, a hole transport layer material, a light emitting layer material, an electron transport layer material sequentially on the anode by a vacuum evaporation deposition method and by adapting a multi-source organic molecular vapor deposition system, to form a hole injection layer, a hole transport layer, a light emitting layer and an electron transport layer sequentially;
depositing a surfactant embedded polyacid composite solution on the electron transport layer by a material spin-on method in an inert gas environment to form an electron injection layer; and
forming a cathode on the electron injection layer by the vacuum evaporation deposition method to form the OLED device;
wherein the electron injection layer comprises tetraoctylammonium embedded silicotungstic acid.

15. The method for fabricating the OLED device according to claim 14, wherein a molecular formula of tetraoctylammonium embedded silicotungstic acid is $[(C_8H_{17})_4N]_4[SiW_{12}O_{40}]$, the thickness of the electron injection layer is between 0.5 nm and 10 nm, a material of the anode is at least one of a transparent conductive metal oxide material and a high work function metal material, a thickness of the anode is between 20 nm and 200 nm, a material of the hole injection layer is organic small molecule hole injection material, polymer hole injection material or metal oxide hole injection material, the hole injection layer is fabricated by the vacuum evaporation deposition method or a wet film-forming method, a thickness of the hole injection layer is between 1 nm and 100 nm, a material of the hole transport layer is an organic small molecule hole transport material or a polymer hole transport material, the hole transport layer is fabricated by the vacuum evaporation deposition method or the wet film-forming method, a thickness of the hole injection layer is between 10 m and 200 m, a material of the light emitting layer is an organic small molecule fluorescent material, a polymer fluorescent material, a small molecule phosphorescent material or a polymer phosphorescent material, a light emitting layer is fabricated by the vacuum evaporation deposition method or the wet film-forming method, the thickness of the light emitting layer is between 5 nm and 50 nm, a material of the electron transport layer is an organic electron transport material or an imidazole electron transport material, the electron transport layer is fabricated by the wet film-forming method, a thickness of the electron transport layer is between 10 nm and 100 nm, a material of the cathode is a metal material with a low work function, the cathode is fabricated by the vacuum evaporation deposition method, the thickness of the cathode is between 10 nm and 1000 nm.

* * * * *